(12) United States Patent
Choi

(10) Patent No.: US 12,720,754 B2
(45) Date of Patent: Aug. 25, 2026

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Eun Seok Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 332 days.

(21) Appl. No.: 18/641,654

(22) Filed: Apr. 22, 2024

(65) Prior Publication Data

US 2024/0276731 A1 Aug. 15, 2024

Related U.S. Application Data

(62) Division of application No. 17/356,173, filed on Jun. 23, 2021, now Pat. No. 11,997,852.

(30) Foreign Application Priority Data

Dec. 14, 2020 (KR) ........................ 10-2020-0174575

(51) Int. Cl.
*H10B 43/50* (2023.01)
*H10B 41/27* (2023.01)
(Continued)

(52) U.S. Cl.
CPC ............. *H10B 43/50* (2023.02); *H10B 41/27* (2023.02); *H10B 41/41* (2023.02); *H10B 41/50* (2023.02);
(Continued)

(58) Field of Classification Search
CPC ........ H10B 43/50; H10B 41/27; H10B 41/41; H10B 41/50; H10B 43/27; H10B 43/40;
(Continued)

(56) References Cited

U.S. PATENT DOCUMENTS 11,963,361 B2 * 4/2024 Hwang .................. H10B 43/40
2013/0277731 A1 10/2013 Goda et al.
(Continued)

FOREIGN PATENT DOCUMENTS

CN 112041986 A 12/2020
KR 1020170042449 A 4/2017
(Continued)

*Primary Examiner* — David Vu
(74) *Attorney, Agent, or Firm* — WILLIAM PARK AND ASSOCIATES LTD.

(57) ABSTRACT

A semiconductor device includes a stacked body including stacked insulating layers and stacked conductive layers; a cell plug; a connection contact structure; and a source layer coupled to the cell plug. The cell plug includes upper and lower portions, the connection contact structure includes a first connection contact disposed at substantially the same level as the lower portion of the cell plug, and a second connection contact disposed at substantially the same level as the upper portion thereof, a level at which the first and second connection contacts contact each other is substantially the same as a level at which the upper and lower portions of the cell plug contact each other, and a level of an uppermost portion of the second connection contact is higher than a level of a bottom surface of the source layer, and is lower than a level of a top surface thereof.

7 Claims, 15 Drawing Sheets

(51) Int. Cl.

| | |
|---|---|
| ***H10B 41/41*** | (2023.01) |
| ***H10B 41/50*** | (2023.01) |
| ***H10B 43/27*** | (2023.01) |
| ***H10B 43/40*** | (2023.01) |
| ***H10B 63/00*** | (2023.01) |
| ***H10W 20/20*** | (2026.01) |

(52) U.S. Cl.
CPC ............ *H10B 43/27* (2023.02); *H10B 43/40* (2023.02); *H10B 63/34* (2023.02); *H10B 63/845* (2023.02); *H10W 20/20* (2026.01)

(58) Field of Classification Search
CPC ...... H10B 63/34; H10B 63/845; H10B 43/30; H10W 20/20; H10W 20/069; H10W 70/611; H10W 70/65
See application file for complete search history.

(56) References Cited

U.S. PATENT DOCUMENTS

| | | | |
|---|---|---|---|
| 2017/0162592 | A1 | 6/2017 | Nishikawa et al. |
| 2019/0341399 | A1 | 11/2019 | Tao et al. |
| 2020/0144285 | A1 | 5/2020 | Lee et al. |
| 2020/0227397 | A1 | 7/2020 | Yada et al. |
| 2020/0365617 | A1 | 11/2020 | Ahn et al. |
| 2021/0118511 | A1 | 4/2021 | Huo et al. |
| 2021/0118989 | A1 | 4/2021 | Liu et al. |
| 2021/0358941 | A1 | 11/2021 | Kajiwara et al. |

FOREIGN PATENT DOCUMENTS

| | | | |
|---|---|---|---|
| KR | 1020180122847 | A | 11/2018 |
| KR | 1020200018064 | A | 2/2020 |
| KR | 1020200039800 | A | 4/2020 |
| KR | 1020200078752 | A | 7/2020 |
| KR | 1020200132570 | A | 11/2020 |
| KR | 1020210028249 | A | 3/2021 |
| KR | 1020210091274 | A | 7/2021 |
| KR | 1020210112051 | A | 9/2021 |
| KR | 1020220084765 | A | 6/2022 |

* cited by examiner

SEMICONDUCTOR DEVICE AND METHOD OF MANUFACTURING SEMICONDUCTOR DEVICE

CROSS-REFERENCE TO RELATED APPLICATION

The present application is a divisional application of U.S. patent application Ser. No. 17/356,173, filed on Jun. 23, 2021, and claims priority under 35 U.S.C. § 119(a) to Korean patent application number 10-2020-0174575, filed on Dec. 14, 2020, in the Korean Intellectual Property Office, the entire contents of which applications are incorporated herein by reference.

BACKGROUND

1. Technical Field

Various embodiments of the present disclosure relate to a semiconductor device and a method of manufacturing the semiconductor device, and more particularly, to a three-dimensional semiconductor device and a method of manufacturing the three-dimensional semiconductor device.

2. Related Art

Semiconductor memory devices include memory cells which are configured to store data. A three-dimensional semiconductor memory device includes memory cells arranged in three dimensions, thus reducing the area occupied by the memory cells per unit area of a substrate.

In order to improve the degree of integration of the three-dimensional semiconductor memory device, the number of stacked memory cells may be increased. As the number of the stacked memory cells increases, the operational reliability of the three-dimensional semiconductor memory device may deteriorate.

SUMMARY

An embodiment of the present disclosure may provide for a semiconductor device, including a stacked body including stacked insulating layers and stacked conductive layers which are alternately stacked; a cell plug passing through the stacked body; a connection contact structure disposed at substantially the same level as the cell plug; and a source layer coupled to the cell plug, wherein the cell plug may include an upper portion and a lower portion, wherein the connection contact structure may include a first connection contact disposed at substantially the same level as the lower portion of the cell plug, and a second connection contact disposed at substantially the same level as the upper portion of the cell plug, wherein a level at which the first and second connection contacts contact each other may be substantially the same as a level at which the upper and lower portions of the cell plug contact each other, and wherein a level of an uppermost portion of the second connection contact may be higher than a level of a bottom surface of the source layer and may be lower than a level of a top surface of the source layer.

An embodiment of the present disclosure may provide for a semiconductor device, including a stacked body including a core portion and a stepped portion; a cell plug passing through the core portion of the stacked body; a first support plug enclosed by the stepped portion of the stacked body; and a source layer coupled to the cell plug, wherein an uppermost portion of the first support plug may be disposed in the source layer.

An embodiment of the present disclosure may provide for a semiconductor device, including a stacked body including stacked insulating layers and stacked conductive layers which are alternately stacked; a cell plug passing through the stacked body; a first connection contact disposed at substantially the same level as a portion of the cell plug; a source layer coupled to the cell plug; and a first conductive contact coupled to the first connection contact, wherein a width of the first connection contact may decrease as it approaches the first conductive contact, wherein a width of the first conductive contact may decreases as it approaches the first connection contact, and wherein a level at which the first connection contact and the first conductive contact each other may be higher than a level of a bottom surface of the source layer and may be lower than a level of a top surface of the source layer.

An embodiment of the present disclosure may provide for a method of manufacturing a semiconductor device, including forming first stacked insulating layers and first stacked sacrificial layers; forming a cell sacrificial structure passing through the first stacked insulating layers and the first stacked sacrificial layers; forming a first connection contact at substantially the same level as the cell sacrificial structure; forming second stacked insulating layers and second stacked sacrificial layers on the cell sacrificial structure; forming a first hole to expose the cell sacrificial structure; removing the cell sacrificial structure to form a second hole; forming a cell plug in the first and second holes; forming a third hole to expose the first connection contact; and forming a second connection contact in the third hole that is coupled to the first connection contact.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to a semiconductor device and a method of manufacturing the semiconductor device, capable of minimizing the manufacturing time and manufacturing cost of the semiconductor device.

Figure 1A:
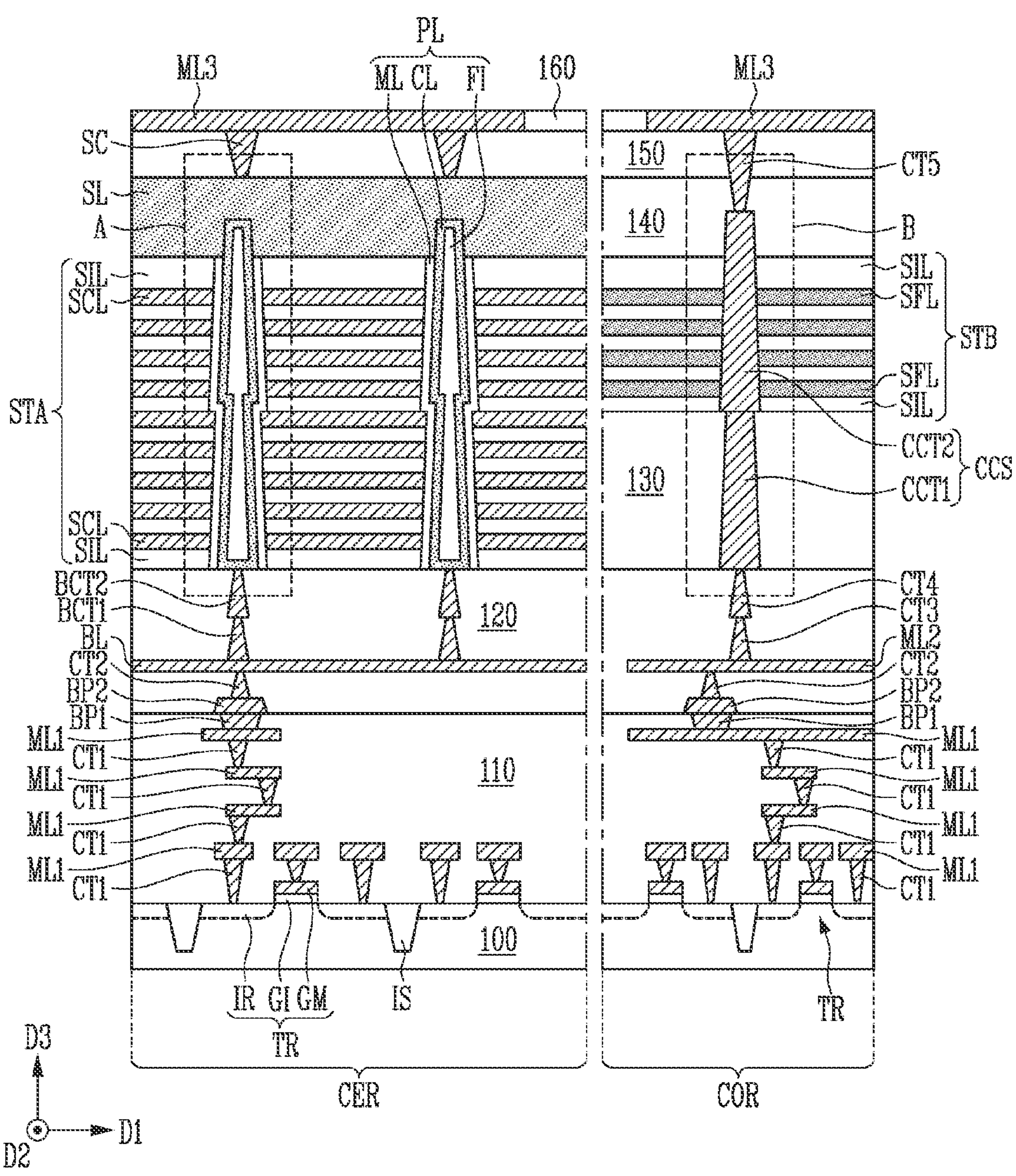
FIG. 1A is a sectional view illustrating a semiconductor device in accordance with an embodiment of the present disclosure.
Figure 1B:
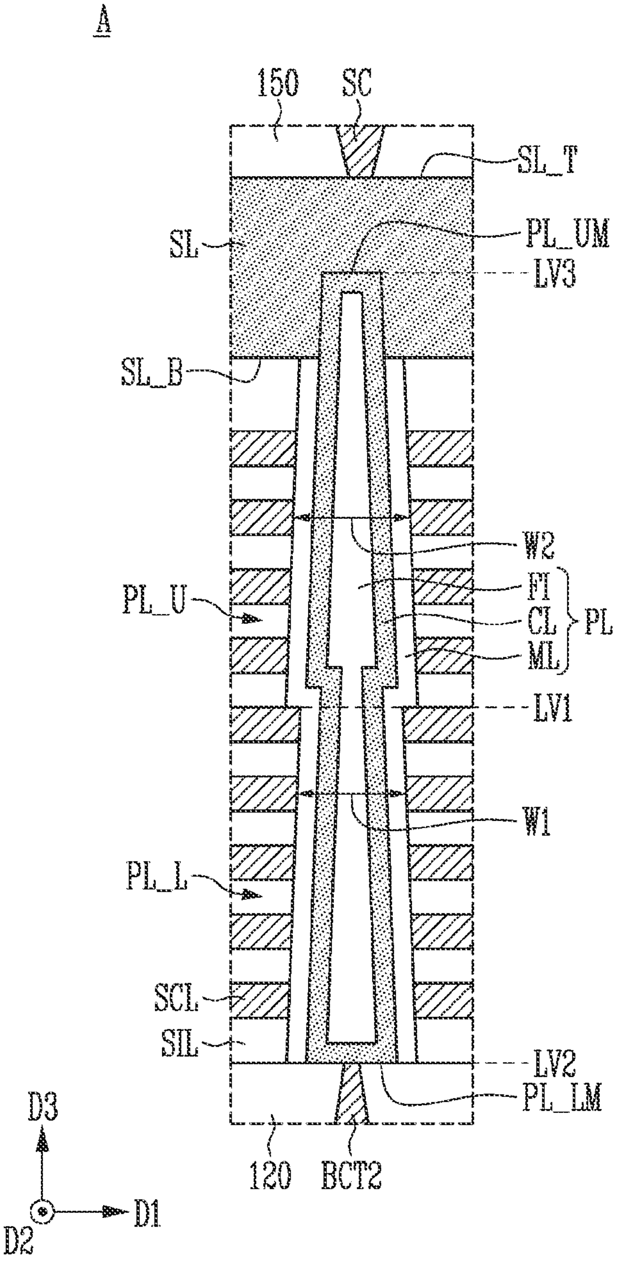
FIG. 1B is an enlarged view of region A of FIG. 1A.
Figure 1C:
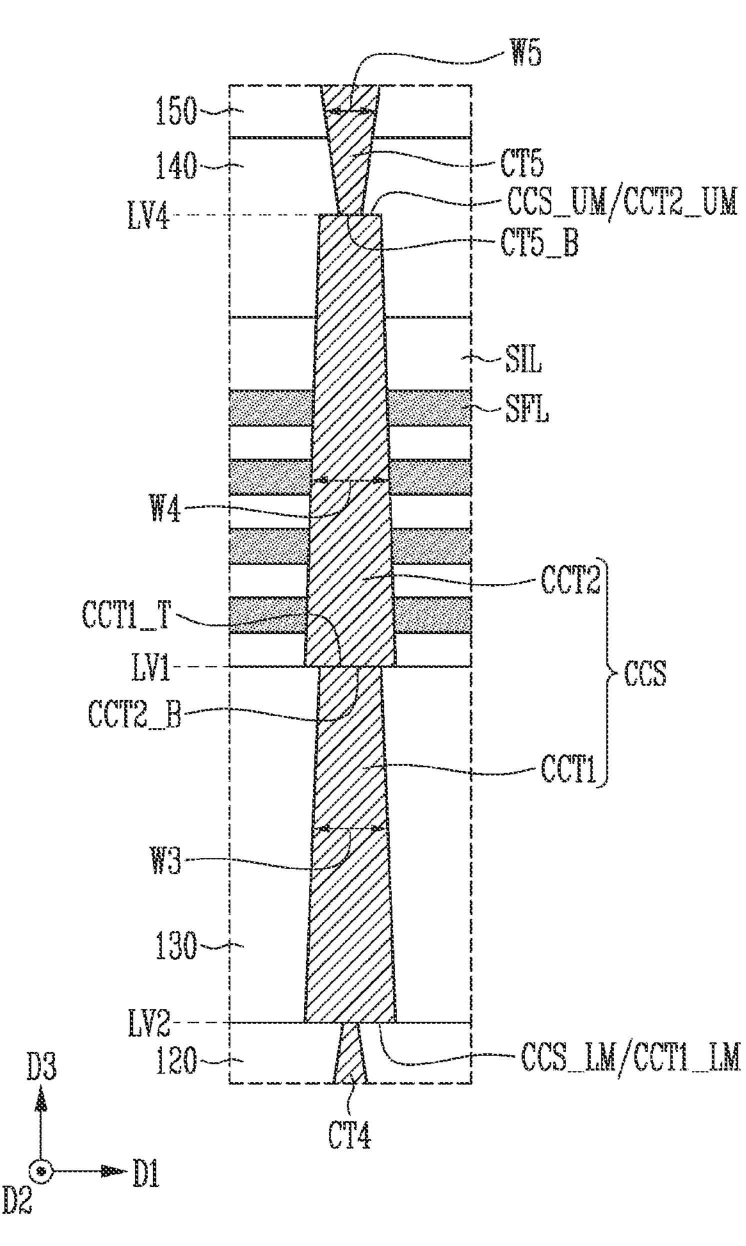
FIG. 1C is an enlarged view of region B of FIG. 1A.

FIG. 1A is a sectional view illustrating a semiconductor device in accordance with an embodiment of the present disclosure. FIG. 1B is an enlarged view of region A of FIG. 1A. FIG. 1C is an enlarged view of region B of FIG. 1A.

Referring to FIG. 1A, the semiconductor device may include a first substrate 100. The first substrate 100 may have the shape of a plate that extends along a plane that is defined by a first direction D1 and a second direction D2. The first direction D1 and the second direction D2 may intersect with each other. For example, the first direction D1 and the second direction D2 may be perpendicular to each other. The first substrate 100 may include a semiconductor material. For example, the first substrate 100 may include silicon.

The first substrate 100 may include a cell region CER and a connection region COR. The cell region CER and the connection region COR may be regions divided by a plane defined by the first direction D1 and the second direction D2.

A first insulating layer 110 covering the first substrate 100 may be provided. The first insulating layer 110 may include an insulating material. For example, the first insulating layer 110 may include oxide or nitride. The first insulating layer 110 may include a multiple insulating layer.

Peripheral transistors TR may be provided between the first substrate 100 and the first insulating layer 110. Each of the peripheral transistors TR may include impurity regions IR, a gate insulating layer GI, and a gate electrode GM. The impurity regions IR may be formed by doping impurities into the first substrate 100. The gate insulating layer GI may include an insulating material. For example, the gate insulating layer GI may include oxide. The gate electrode GM may include a conductive material. For example, the gate electrode GM may include tungsten.

Element separation layers IS may be provided in the first substrate 100. The element separation layers IS may electrically separate the peripheral transistors TR from each other. The element separation layers IS may include an insulating material. For example, the element separation layers IS may include oxide.

First conductive contacts CT1 and first lines ML1 may be provided in the first insulating layer 110. The first conductive contact CT1 may couple the peripheral transistor TR and the first line ML1 to each other or may couple the first lines ML1 to each other. The first line ML1 may be coupled to the first conductive contact CT1. The first conductive contacts CT1 and the first lines ML1 may include a conductive material. For example, the first conductive contacts CT1 and the first lines ML1 may include tungsten.

First bonding pads BP1 may be provided in the first insulating layer 110. The first bonding pad BP1 may be coupled to the first line ML1. The width of the first bonding pad BP1 may be reduced as the first bonding pad approaches the first substrate 100. For example, the width of the first bonding pad BP1 in the first direction D1 may decrease as the first bonding pad approaches the first substrate 100. The first bonding pads BP1 may include a conductive material. For example, the first bonding pads BP1 may include copper.

A second insulating layer 120 that covers the first insulating layer 110 may be provided. The second insulating layer 120 may include an insulating material. For example, the second insulating layer 120 may include oxide or nitride. The second insulating layer 120 may include a multiple insulating layer.

Second bonding pads BP2 may be provided in the second insulating layer 120. The second bonding pad BP2 may be coupled to the first bonding pad BP1. The width of the second bonding pad BP2 may increase as the second bonding pad approaches the first bonding pad BP1. For example, the width of the second bonding pad BP2 in the first direction D1 may increase as the second bonding pad approaches the first bonding pad BP1 in the negative direction of a third direction D3. The width of the first bonding pad BP1 may increase as the first bonding pad approaches the second bonding pad BP2. For example, the width of the first bonding pad BP1 in the first direction D1 may increase as the first bonding pad approaches the second bonding pad BP2 in the positive direction of the third direction D3. The second bonding pads BP2 may include a conductive material. For example, the second bonding pads BP2 may include copper.

Second conductive contacts CT2, a second line ML2, a bit line BL, first bit line contacts BCT1, second bit line contacts BCT2, a third conductive contact CT3, and a fourth conductive contact CT4 may be provided in the second insulating layer 120. The second conductive contact CT2 may be coupled to the second bonding pad BP2. The bit line BL may be disposed on the cell region CER of the first substrate 100. The bit line BL may be coupled to the second conductive contact CT2. The second line ML2 may be disposed on the connection region COR of the first substrate 100. The second line ML2 may be coupled to the second conductive contact CT2. The first and second bit line contacts BCT1 and BCT2 may be disposed on the cell region CER of the first substrate 100. The first bit line contact BCT1 may be coupled to the bit line BL. The second bit line contact BCT2 may be coupled to the first bit line contact BCT1. The third and fourth conductive contacts CT3 and CT4 may be disposed on the connection region COR of the first substrate 100. The third conductive contact CT3 may be coupled to the second line ML2. The fourth conductive contact CT4 may be coupled to the third conductive contact CT3. The second conductive contacts CT2, the second line ML2, the bit line BL, the first bit line contacts BCT1, the second bit line contacts BCT2, the third conductive contact CT3, and the fourth conductive contact CT4 may include a conductive material. For instance, the second conductive contacts CT2, the second line ML2, the bit line BL, the first bit line contacts BCT1, the second bit line contacts BCT2, the third conductive contact CT3, and the fourth conductive contact CT4 may include tungsten.

A first stacked body STA may be provided on the second insulating layer 120. The first stacked body STA may be disposed on the cell region CER of the first substrate 100. The first stacked body STA may include stacked insulating layers SIL and stacked conductive layers SCL that are alternately stacked in the third direction D3. The stacked conductive layers SCL may be used as a word line or a selection line of the semiconductor device. The stacked conductive layers SCL may include a conductive material. For example, the stacked conductive layers SCL may include tungsten. The stacked insulating layers SIL may include an insulating material. For example, the stacked insulating layers SIL may include oxide.

Cell plugs PL may be provided to pass through the first stacked body STA. The cell plugs PL may be disposed on the cell region CER of the first substrate 100. The cell plugs PL may extend in the third direction D3. The cell plug PL may include a filling layer FI, a channel layer CL that encloses the filling layer FI, and a memory layer ML that encloses the channel layer CL. The filling layer FI, the channel layer CL, and the memory layer ML may extend in the third direction D3 to pass through the first stacked body STA. The channel layer CL of the cell plug PL may be coupled to the second bit line contact BCT2.

The filling layer FI may include an insulating material. For example, the filling layer FI may include oxide. The channel layer CL may include a semiconductor material. For example, the channel layer CL may include polysilicon. The memory layer ML may include a tunnel insulating layer that encloses the channel layer CL, a data storage layer that encloses the tunnel insulating layer, and a blocking layer that encloses the data storage layer. The tunnel insulating layer may include a material that makes charge tunneling possible. For example, the tunnel insulating layer may include oxide. In an embodiment, the data storage layer may include a material capable of trapping charges. For example, the data storage layer may include nitride. In an embodiment, the data storage layer may include various materials according to the data storage method. For example, the data storage layer may include silicon, phase-change material, or nanodots. The blocking layer may include a material that may block the movement of charges. For example, the blocking layer may include oxide.

A third insulating layer 130 and a second stacked body STB may be provided on the second insulating layer 120. The third insulating layer 130 may be disposed on the connection region COR of the first substrate 100. The third insulating layer 130 may include an insulating material. For example, the third insulating layer 130 may include oxide or nitride. The third insulating layer 130 may include a multiple insulating layer. The second stacked body STB may be disposed on the third insulating layer 130. The second stacked body STB may include stacked insulating layers SIL and stacked sacrificial layers SFL which are alternately stacked in the third direction D3. The stacked sacrificial layers SFL may be a portion remaining without being replaced by the stacked conductive layers SCL in a manufacturing process. For example, the stacked sacrificial layers SFL may include nitride.

A connection contact structure CCS may be provided to pass through the second stacked body STB and the third insulating layer 130. The connection contact structure CCS may be disposed on the connection region COR. The connection contact structure CCS may extend in the third direction D3. The connection contact structure CCS may be coupled to the fourth conductive contact CT4. The connection contact structure CCS may be disposed on substantially the same level as the cell plug PL.

The connection contact structure CCS may include a first connection contact CCT1 and a second connection contact CCT2. The first connection contact CCT1 may pass through the second stacked body STB, while the second connection contact CCT2 may pass through the third insulating layer 130. For reference, the height of the second stacked body STB and the third insulating layer 130 may be varied. The second stacked body STB may be lower in height than the second connection contact CCT2 or may be higher in height than the second connection contact CCT2. At least a portion of the first connection contact CCT1 may pass through the second stacked body STB.

The first connection contact CCT1 and the second connection contact CCT2 may extend in the third direction D3. The first connection contact CCT1 may be coupled to the fourth conductive contact CT4. The second connection contact CCT2 may be disposed on the first connection contact CCT1. The first and second connection contacts CCT1 and CCT2 may include a conductive material. For reference, the first and second connection contacts CCT1 and CCT2 may include tungsten.

A source layer SL may be provided on the first stacked body STA. The source layer SL may be disposed on the first stacked body STA in the cell region CER of the first substrate 100. The source layer SL may have the shape of a plate that extends along a plane that is defined by the first direction D1 and the second direction D2. The source layer SL may be coupled to the channel layer CL of the cell plug PL. The source layer SL may include a conductive material. For example, the source layer SL may include polysilicon.

A fourth insulating layer 140 may be provided on the second stacked body STB. The fourth insulating layer 140 may be disposed on the connection region COR of the first substrate 100. The fourth insulating layer 140 may include an insulating material. For example, the fourth insulating layer 140 may include oxide or nitride.

A fifth insulating layer 150 may be provided to cover the source layer SL and the fourth insulating layer 140. The fifth insulating layer 150 may include an insulating material. For example, the fifth insulating layer 150 may include oxide or nitride.

Source contacts SC may be provided in the fifth insulating layer 150. The source contacts SC may be disposed on the cell region CER of the first substrate 100. The source contacts SC may be coupled to the source layer SL. The source contacts SC may include a conductive material. For example, the source contacts SC may include tungsten.

A fifth conductive contact CT5 may be provided to pass through the fifth insulating layer 150. The fifth conductive contact CT5 may be disposed on the connection region COR of the first substrate 100. The fifth conductive contact CT5 may be coupled to the second connection contact CCT2 of the connection contact structure CCS. The fifth conductive contact CT5 may include a conductive material. For example, the fifth conductive contact CT5 may include tungsten.

A sixth insulating layer 160 may be provided to cover the fifth insulating layer 150. The sixth insulating layer 160 may include an insulating material. For example, the sixth insulating layer 160 may include oxide or nitride.

Third lines ML3 may be provided in the sixth insulating layer 160. The third line ML3 may be coupled to the source contact SC or the fifth conductive contact CT5. The third lines ML3 may include a conductive material. For example, the third lines ML3 may include tungsten.

Referring to FIG. 1B, the cell plug PL may include an upper portion PL_U and a lower portion PL_L. The level at which the upper portion PL_U and the lower portion PL_L of the cell plug PL contact each other may be defined as a first level LV1. The lower portion PL_L of the cell plug PL may be coupled to the second bit line contact BCT2. The upper portion PL_U of the cell plug PL may be coupled to the source layer SL.

The width of the lower portion PL_L of the cell plug PL may decrease as the level increases, moving up in the third direction D3. The width of the lower portion PL_L of the cell plug PL may decrease as the lower portion approaches the source layer SL. For example, the width of the lower portion PL_L of the cell plug PL in the first direction D1 may be defined as a first width W1. The first width W1 may decrease as the level increases, moving up in the third direction D3, and the first width W1 may decrease as the lower portion approaches the source layer SL.

The width of the upper portion PL_U of the cell plug PL may decrease as the level increases, moving up in the third direction D3. The width of the upper portion PL_U of the cell plug PL may decrease as the upper portion approaches the source layer SL. For example, the width of the upper portion PL_U of the cell plug PL in the first direction D1 may be defined as a second width W2. The second width W2 may decrease as the level increases, moving up in the third direction D3, and the second width W2 may decrease as the upper portion approaches the source layer SL.

The minimum width of the lower portion PL_L of the cell plug PL may be smaller than the maximum width of the upper portion PL_U of the cell plug PL. For example, the minimum value of the first width W1 may be smaller than the maximum value of the second width W2.

The level of the lowermost portion PL_LM of the cell plug PL may be defined as a second level LV2. The level of the uppermost portion PL_UM of the cell plug PL may be defined as a third level LV3. The third level LV3 may be higher than the level of the bottom surface SL_B of the source layer SL. The third level LV3 may be lower than the level of the top surface SL_T of the source layer SL. The uppermost portion PL_UM of the cell plug PL may be disposed in the source layer SL. The uppermost portion PL_UM of the cell plug PL may be disposed between the top surface SL_T and the bottom surface SL_B of the source layer SL.

The uppermost portion PL_UM of the cell plug PL may be defined by the channel layer CL of the cell plug PL. The uppermost portion PL_UM of the cell plug PL may be a surface of the channel layer CL of the cell plug PL. A portion of the channel layer CL of the cell plug PL and a portion of the filling layer FI of the cell plug PL may be disposed in the source layer SL.

Referring to FIG. 1C, the first connection contact CCT1 may be located to correspond to the lower portion PL_L of the cell plug PL. The first connection contact CCT1 may be disposed at substantially the same level as the lower portion PL_L of the cell plug PL. The second connection contact CCT2 may be positioned to correspond to the upper portion PL_U of the cell plug PL. The second connection contact CCT2 may be disposed at substantially the same level as the upper portion PL_U of the cell plug PL. The level of the boundary between the first connection contact CCT1 and the second connection contact CCT2 of the connection contact structure CCS may be substantially the same as the first level LV1. The level of the top surface CCT1_T of the first connection contact CCT1 and the level of the bottom surface CCT2_B of the second connection contact CCT2 may be substantially the same as the first level LV1.

The width of the first connection contact CCT1 may be reduced as the level increase, moving up in the third direction D3. The width of the first connection contact CCT1 may decrease as it approaches a boundary between the first and second connection contacts CCT1 and CCT2. For example, a first width of the first connection contact CCT1 may be defined as a third width W3. The third width W3 may decrease as the level increases, moving up in the third direction D3, and the third width W3 may decrease as it approaches the boundary between the first and second connection contacts CCT1 and CCT2.

The width of the second connection contact CCT2 may be reduced as the level increase, moving up in the third direction D3. The width of the second connection contact CCT2 may increase as it approaches the boundary between the first and second connection contacts CCT1 and CCT2. For example, the width of the second connection contact CCT2 in the first direction D1 may be defined as a fourth width W4. The fourth width W4 may decrease as the level increases, moving up in the third direction D3, and the fourth width W4 may increase as it approaches the boundary between the first and second connection contacts CCT1 and CCT2.

The minimum width of the first connection contact CCT1 may be smaller than the maximum width of the second connection contact CCT2. For example, the minimum value of the third width W3 may be smaller than the maximum value of the fourth width W4.

A level of a lowermost portion CCS_LM of the connection contact structure CCS may be substantially the same as the second level LV2. A level of a lowermost portion CCT1_LM of the first connection contact CCT1 may be substantially the same as the second level LV2.

The level of the uppermost portion CCS_UM of the connection contact structure CCS may be defined as the fourth level LV4. The level of the uppermost portion CCT2_UM of the second connection contact CCT2 may be substantially the same as the fourth level LV4. The level of the uppermost portion CCS_UM of the connection contact structure CCS may be higher than the level of the bottom surface SL_B of the source layer SL. The level of the uppermost portion CCT2_UM of the second connection contact CCT2 may be higher than the level of the bottom surface SL_B of the source layer SL. The level of the uppermost portion CCS_UM of the connection contact structure CCS may be lower than the level of the top surface SL_T of the source layer SL. The level of the uppermost portion CCT2_UM of the second connection contact CCT2 may be lower than the level of the top surface SL_T of the source layer SL.

The level of the boundary between the fifth conductive contact CT5 and the second connection contact CCT2 of the connection contact structure CCS may be substantially the same as the fourth level LV4. The width of the fifth conductive contact CT5 may be reduced as the level is reduced. The width of the fifth conductive contact CT5 may decrease as it approaches the second connection contact CCT2. The width of the fifth conductive contact CT5 may be the smallest at the bottom surface CT5_B of the fifth conductive contact CT5. For example, a width of the fifth conductive contact CT5 in the first direction D1 may be defined as a fifth width W5. The fifth width W5 may decrease as the level decreases, moving down in the negative third direction D3, and the fifth width W5 may decrease as it approaches the second connection contact CCT2. The fifth width W5 may be the smallest at the bottom surface CT5_B of the fifth conductive contact CT5.

The width of the second connection contact CCT2 may be reduced as it approaches the second connection contact CCT2. The width of the second connection contact CCT2 may be the smallest at the uppermost portion CCT2_UM of the second connection contact CCT2. For example, the fourth width W4 may be reduced as it approaches the fifth conductive contact CT5. The fourth width W4 may be the smallest at the uppermost portion CCT2_UM of the second connection contact CCT2.

The semiconductor device in accordance with embodiments of the present disclosure is configured so that the connection contact structure CCS is divided into the first and second connection contacts CCT1 and CCT2, thus minimizing the manufacturing time and manufacturing cost of the semiconductor device.

FIGS. 2A, 2B, 2C, 2D, 2E, and 2F are sectional views illustrating a method of manufacturing a semiconductor device in accordance with an embodiment of the present disclosure. Hereinbelow, repetitive explanation will be omitted if deemed redundant.

Figure 2A:
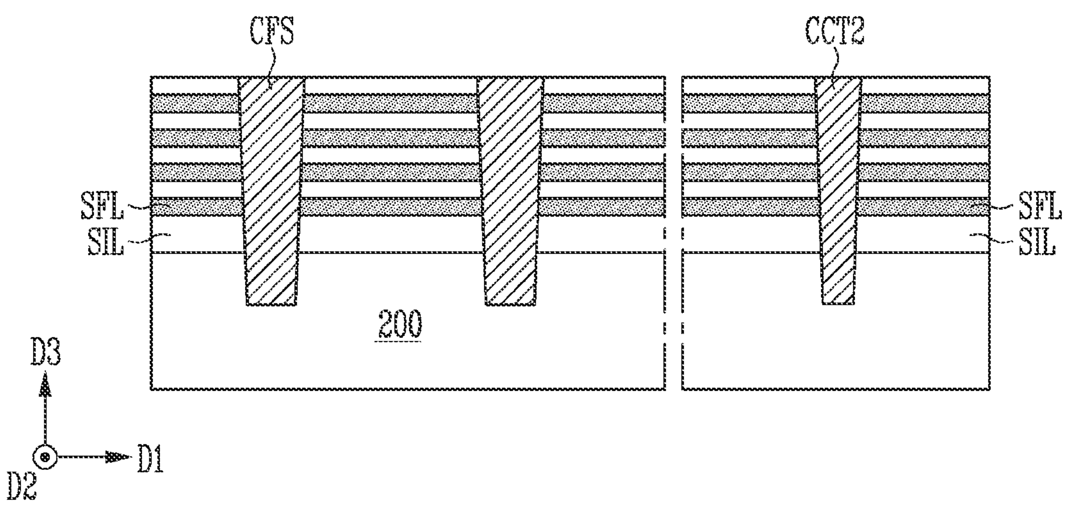
FIGS. 2A, 2B, 2C, 2D, 2E, and 2F are sectional views illustrating a method of manufacturing a semiconductor device in accordance with an embodiment of the present disclosure.

Referring to FIG. 2A, a second substrate 200 may be formed. The second substrate 200 may have the shape of a plate that extends along a plane that is defined by a first direction D1 and a second direction D2. For example, the second substrate 200 may be a semiconductor substrate.

Stacked insulating layers SIL and stacked sacrificial layers SFL may be alternately stacked on the second substrate 200. The stacked insulating layer SIL and the stacked sacrificial layer SFL formed on the second substrate 200 may be defined as a first stacked insulating layer and a first stacked sacrificial layer, respectively. The stacked sacrificial layers SFL may include a material different from that of the stacked insulating layers SIL. For example, the stacked sacrificial layers SFL may include nitride.

Cell sacrificial structures CFS may be formed to pass through the stacked insulating layers SIL and the stacked sacrificial layers SFL. Each of the cell sacrificial structures CFS may have a cylindrical shape. The cell sacrificial structures CFS may extend in a third direction D3. For example, the sacrificial structures CFS may include tungsten.

A second connection contact CCT2 may be formed to pass through the stacked insulating layers SIL and the stacked sacrificial layers SFL. The second connection contact CCT2 may be formed when the cell sacrificial structure CFS is formed. The second connection contact CCT2 may include the same material as the cell sacrificial structure CFS. The second connection contact CCT2 may be formed at substantially the same level as the cell sacrificial structure CFS in the third direction D3.

Figure 2B:
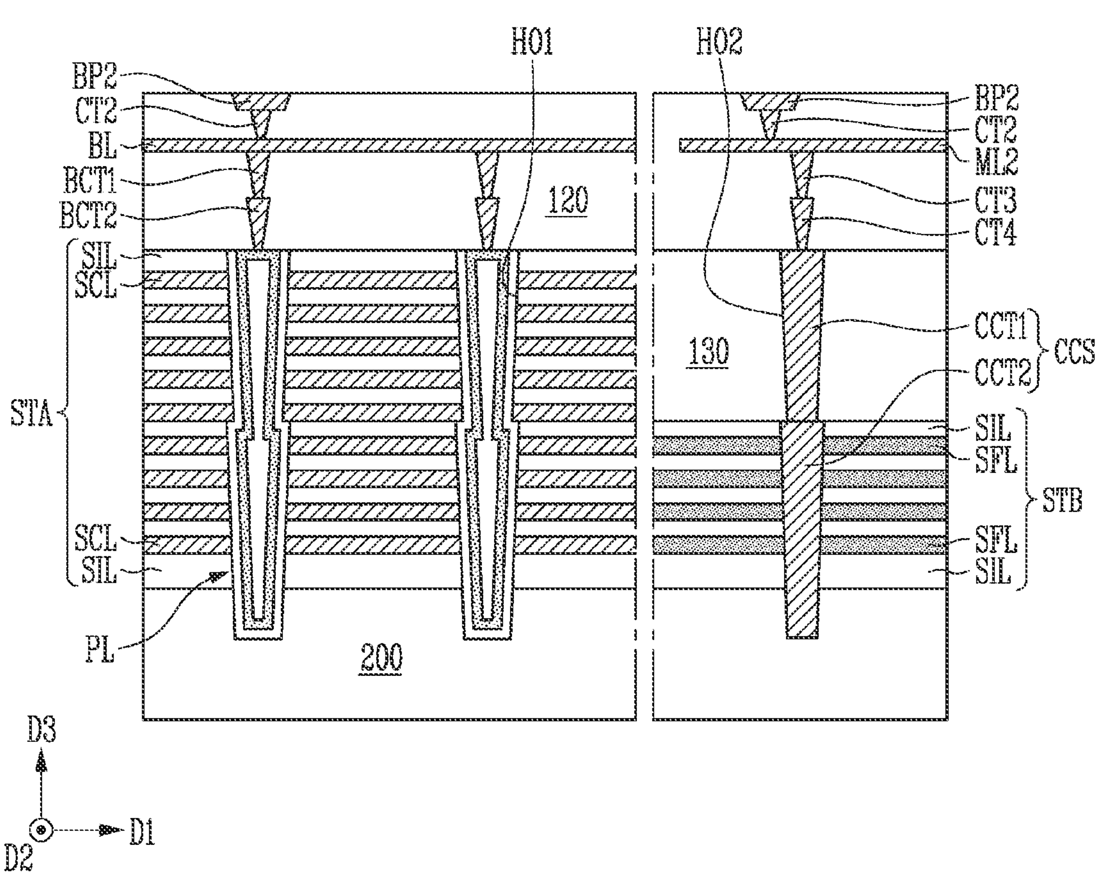

Referring to FIG. 2B, the stacked insulating layers SIL and the stacked sacrificial layers SFL may be formed on the cell sacrificial structures CFS and the second connection contact CCT2. The stacked insulating layer SIL and the stacked sacrificial layer SFL formed on the cell sacrificial structures CFS may be defined as a second stacked insulating layer and a second stacked sacrificial layer, respectively.

Subsequently, first holes HO1 may be formed to pass through the stacked insulating layer SIL and the stacked sacrificial layer SFL and expose the cell sacrificial structures CFS. Thereafter, the cell sacrificial structures CFS may be removed through the first holes HO1, thereby exposing the second substrate 200 at the bottoms of the first holes HO1. Subsequently, cell plugs PL may be formed in the first holes HO1. Thereafter, the stacked insulating layer SIL and the stacked sacrificial layer SFL may be patterned in a step shape. Subsequently, a third insulating layer 130 may be formed. Thereafter, the stacked sacrificial layers SFL may be replaced with stacked conductive layers SCL. In this case, the stacked sacrificial layers SFL of a first stacked body STA may be replaced with the stacked conductive layers SCL, and the stacked sacrificial layers SFL of a second stacked body STB may remain as they are.

Subsequently, a second hole HO2 may be formed to pass through the third insulating layer 130 and expose the second connection contact CCT2. Subsequently, a first connection contact CCT1 may be formed in the second hole HO2. The first connection contact CCT1 may be coupled to the second connection contact CCT2. The second hole HO2 may be formed at substantially the same level as the first hole HO1 in the third direction D3.

A second insulating layer 120 may be formed to cover the first stacked body STA and the third insulating layer 130. While the second insulating layer 120 is formed, first and second bit line contacts BCT1 and BCT2, a bit line BL, a second line ML2, second to fourth conductive contacts CT2, CT3, and CT4, and second bonding pads BP2 may be formed in the second insulating layer 120.

Figure 2C:
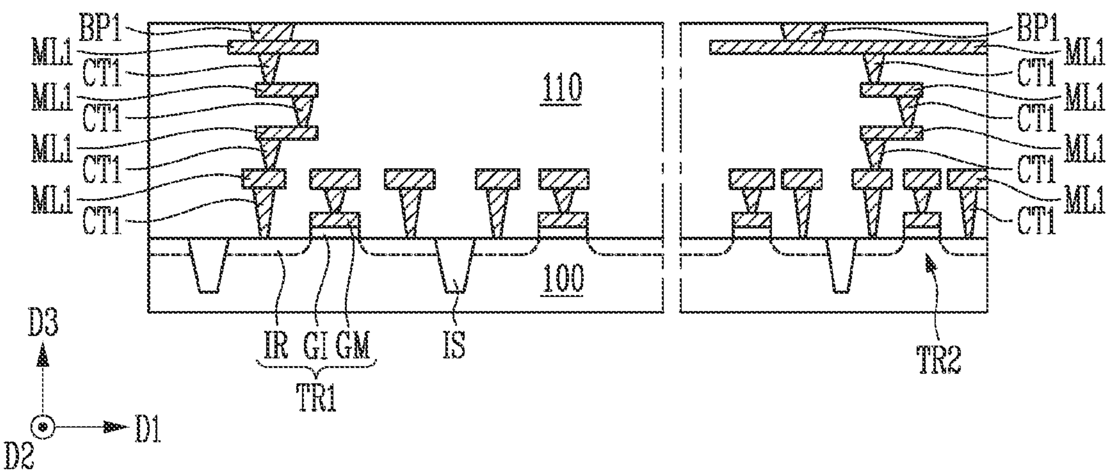

Referring to FIG. 2C, a first substrate 100 may be formed. Peripheral transistors TR and element separation layers IS may be formed on the first substrate 100.

A first insulating layer 110 may be formed to cover the first substrate 100 and the peripheral transistors TR. While the first insulating layer 110 is being formed, first contacts CT1, first lines ML1, and first bonding pads BP1 may be formed.

Figure 2D:
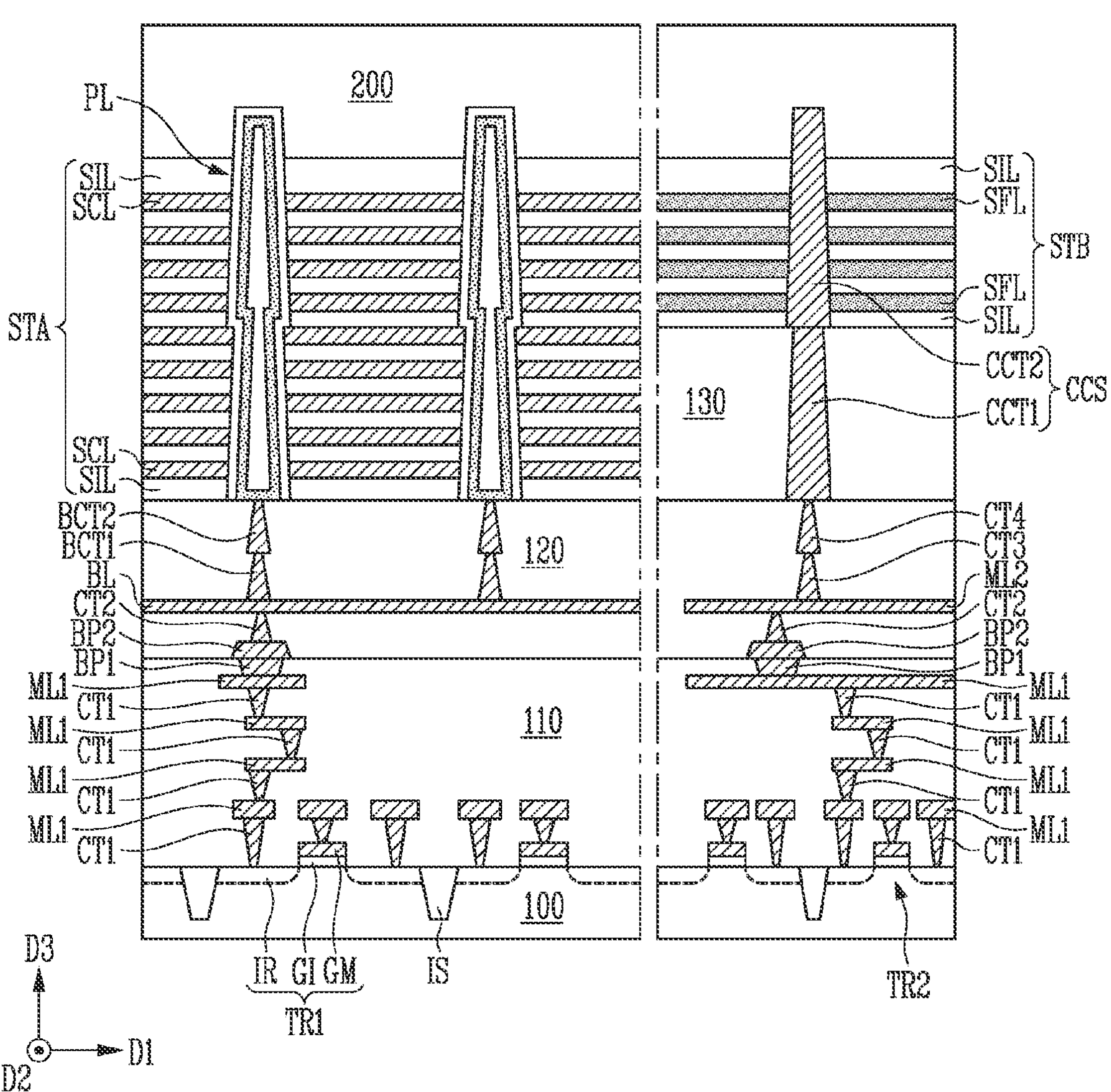

Referring to FIG. 2D, the second substrate 200 may be flipped upside down. The second substrate 200 may be flipped upside down so that components that are formed on the second substrate 200 may be flipped upside down. For instance, the cell plugs PL, the first connection contacts CCT1, and the second connection contacts CCT2 may be flipped upside down.

The second bonding pad BP2 may be coupled to the first bonding pad BP1. The second bonding pad BP2 may be coupled to the first bonding pad BP1 so that the cell plug PL may be electrically coupled to the peripheral transistor TR1. The second bonding pad BP2 may be coupled to the first bonding pad BP1 so that the first connection contact CCT1 and the second connection contact CCT2 of the connection contact structure CCS may be electrically coupled to the peripheral transistor TR2.

Figure 2E:
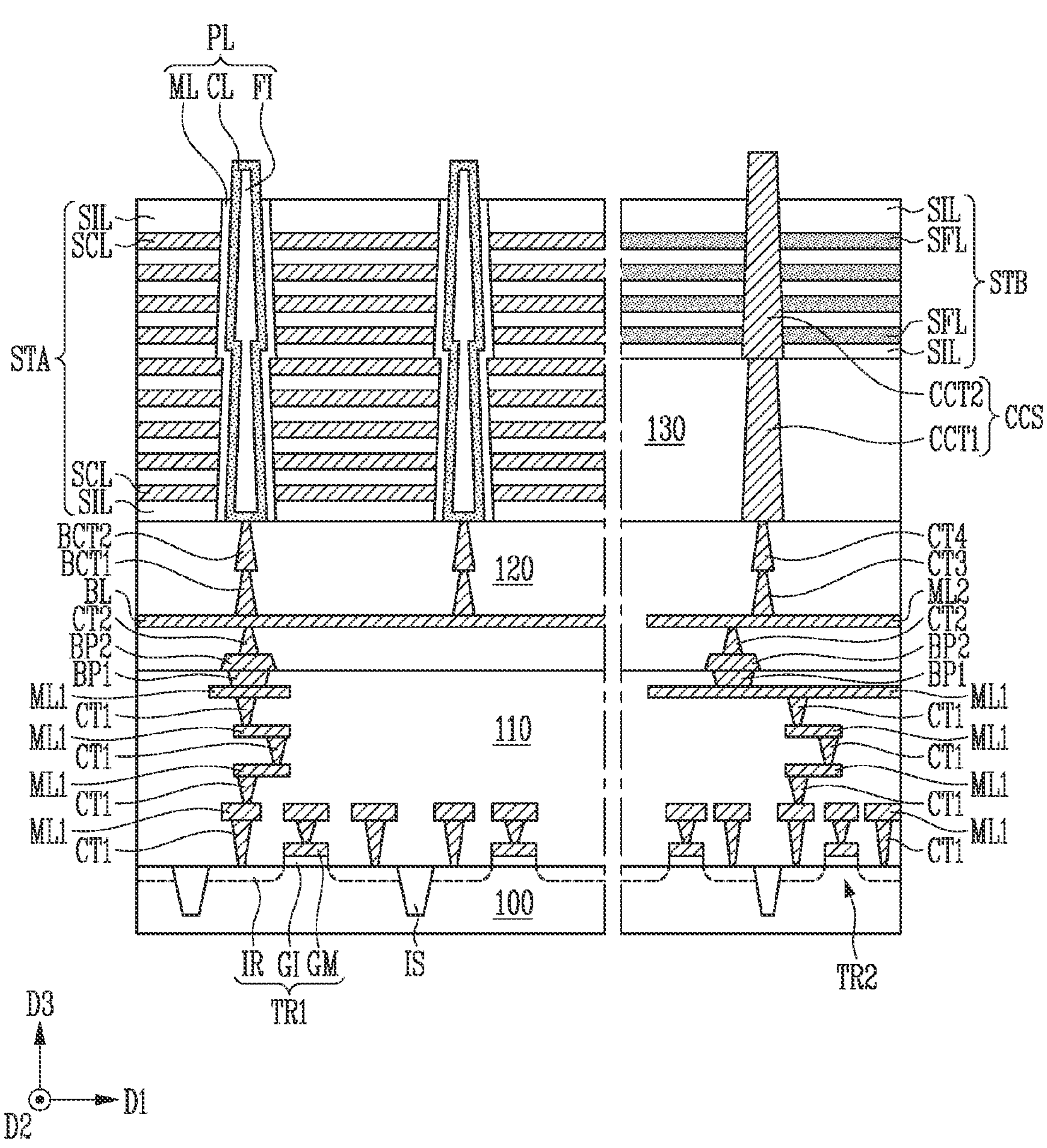

Referring to FIG. 2E, the second substrate 200 may be removed.

As the second substrate 200 is removed, a portion of the memory layer ML that is protruding out of the first stacked body STA may be exposed. Subsequently, a portion of the exposed memory layer ML may be removed. As a portion of the memory layer ML is removed, a portion of a channel layer CL that is protruding out of the first stacked body STA may be exposed.

As the second substrate 200 is removed, a portion of the second connection contact CCT2 of the connection contact structure CCS that is protruding out of the second stacked body STB may be exposed.

Figure 2F:
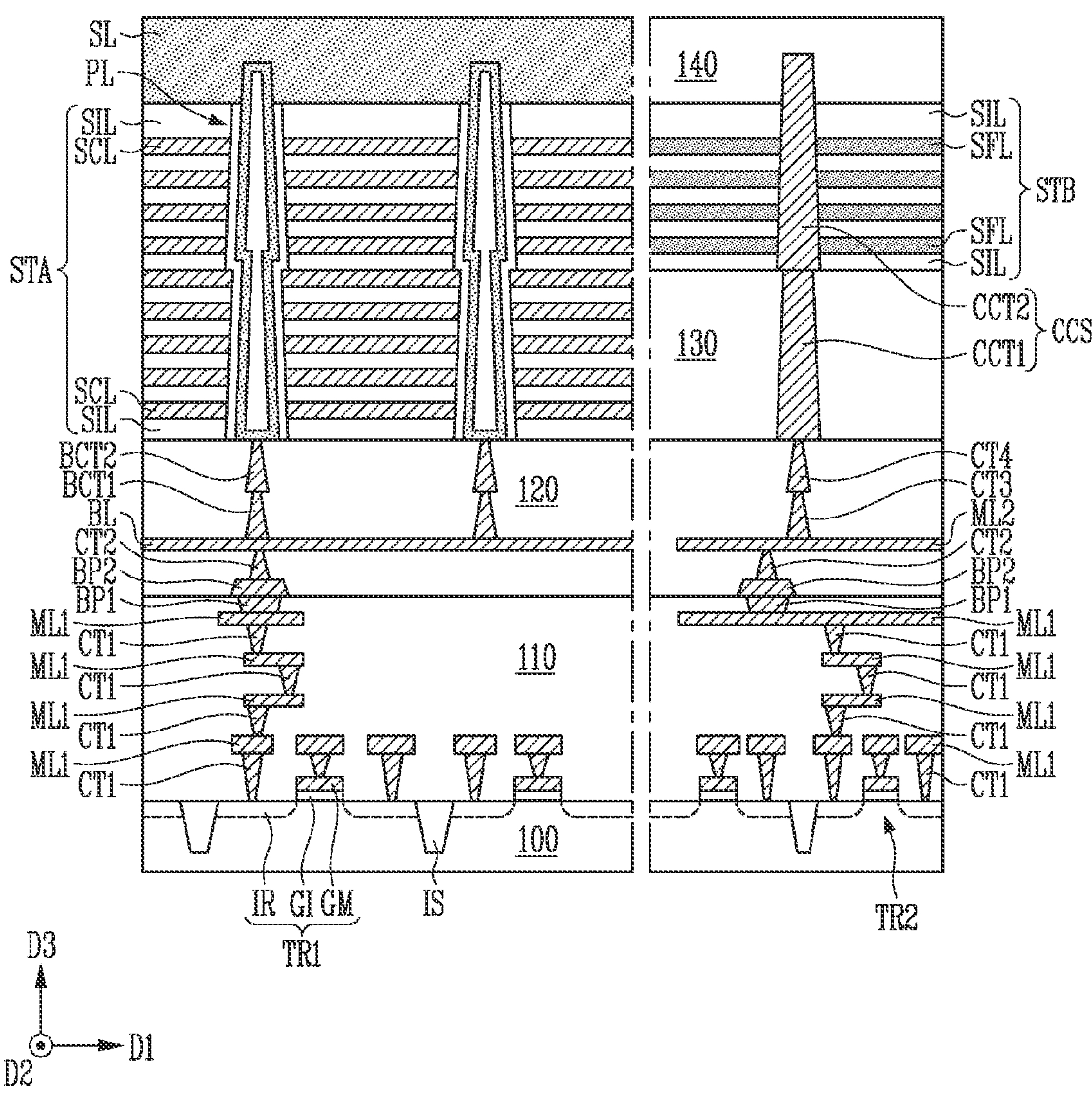

Referring to FIG. 2F, a source layer SL that is coupled to the cell plug PL may be formed, and a fourth insulating layer 140 may be formed to cover the second connection contact CCT2 of the connection contact structure CCS.

Subsequently, a fifth insulating layer 150, a sixth insulating layer 160, source contacts SC, a fifth conductive contact CT5, and third lines ML3 may be formed on the source layer SL and the fourth insulating layer 140 (see FIG. 1A).

A method of manufacturing a semiconductor device according to embodiments of the present disclosure may form the semiconductor device by dividing a connection contact structure CCS into first and second connection contacts CCT1 and CCT2. Therefore, the manufacturing time and manufacturing cost of the semiconductor device can be minimized.

Figure 3:
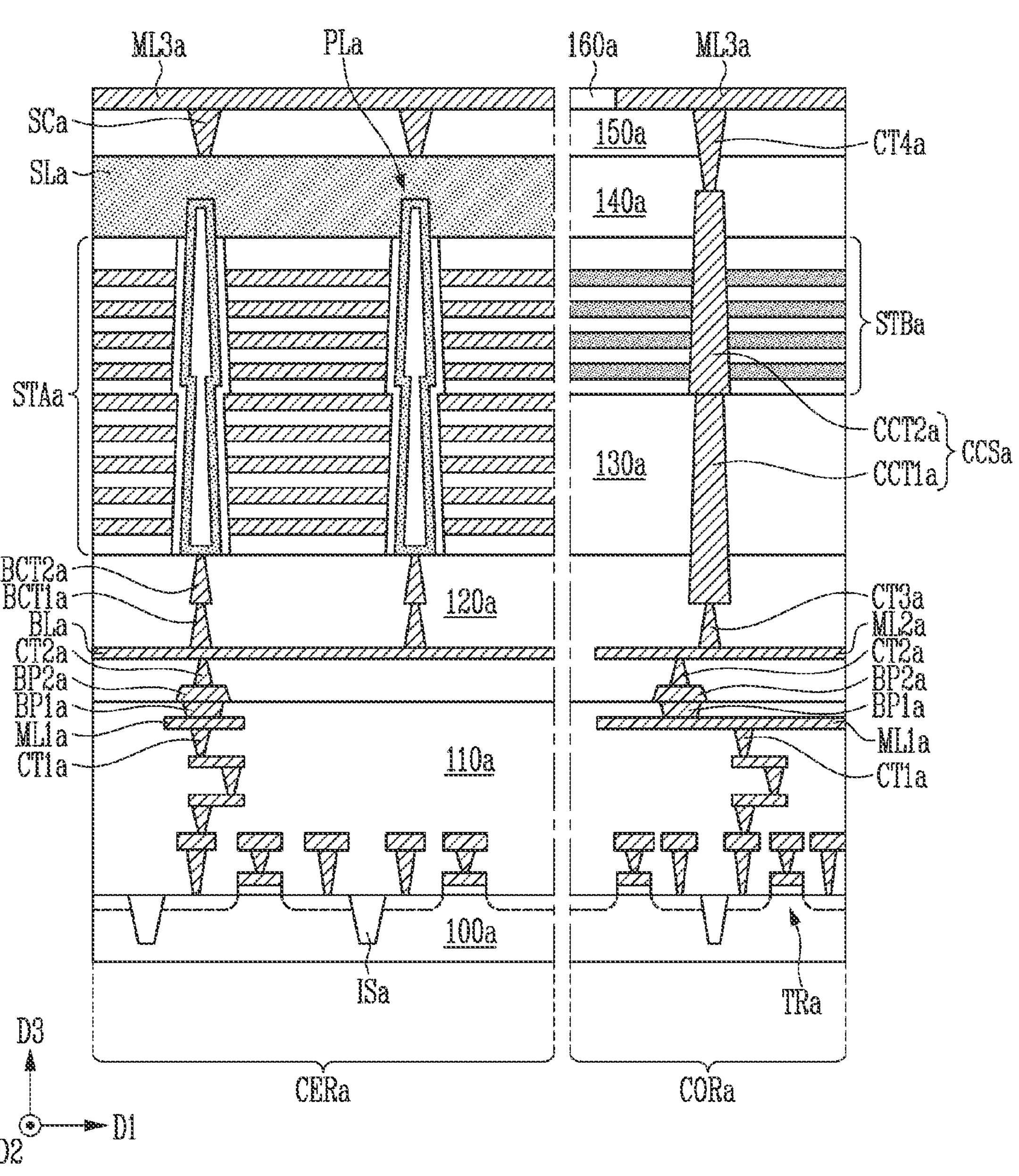
FIG. 3 is a sectional view illustrating a semiconductor device in accordance with an embodiment of the present disclosure.

FIG. 3 is a sectional view illustrating a semiconductor device in accordance with an embodiment of the present disclosure. Hereinbelow, repetitive explanation will be omitted if deemed redundant.

Referring to FIG. 3, the semiconductor device may include a substrate 100*a* with a cell region CERa and a connection region CORa. Peripheral transistors TRa and element separation layers ISa may be provided on the substrate 100*a*.

A first insulating layer 110*a* may be provided to cover the substrate 100*a*. First conductive contacts CT1*a*, first lines ML1*a*, and first bonding pads BP1*a* may be provided in the first insulating layer 110*a*.

A second insulating layer 120*a* may be provided to cover the first insulating layer 110*a*. Second bonding pads BP2*a*, second conductive contacts CT2*a*, a second line ML2*a*, a bit line BLa, first and second bit line contacts BCT1*a* and BCT2*a*, and a third conductive contact CT3*a* may be provided in the second insulating layer 120*a*.

A first stacked body STAa, a third insulating layer 130*a*, and a second stacked body STBa may be provided on the second insulating layer 120*a*. Cell plugs PLa may be provided to pass through the first stacked body STAa. A connection contact structure CCSa may be provided to pass through the second stacked body STBa and the third insulating layer 130*a*. The connection contact structure CCSa may include a first connection contact CCT1*a* and a second connection contact CCT2*a*. The first connection contact CCT1*a* may be coupled to the third conductive contact CT3*a*. The level of the lowermost portion of the connection contact structure CCSa may be lower than the level of the lowermost portion of the cell plug PLa in the third direction D3. The level of a lowermost portion of the first connection contact CCT1*a* may be lower than the level of the lowermost portion of the cell plug PLa in the third direction D3. The level of the lowermost portion of the connection contact structure CCSa may be substantially the same as the level at which the first and second bit line contacts BCT1*a* and BCT2*a* contact each other. Therefore, the level of the lowermost portion of the first connection contact CCT1*a* may be substantially the same as the level at which the first and second bit line contacts BCT1*a* and BCT2*a* contact each other.

A source layer SLa may be provided on the first stacked body STAa. A fourth insulating layer 140*a* may be provided on the second stacked body STBa. A fifth insulating layer 150*a* may be provided to cover the source layer SLa and the fourth insulating layer 140*a*. Source contacts SCa may be provided in the fifth insulating layer 150*a*. A fourth conductive contact CT4*a* may be provided to be coupled to the second connection contact CCT2*a* of the connection contact structure CCSa. The fourth conductive contact CT4*a* may be provided in the fourth insulating layer 140*a* and the fifth insulating layer 150*a*. A sixth insulating layer 160*a* may be provided to cover the fifth insulating layer 150*a*. Third lines ML3*a* may be provided in the sixth insulating layer 160*a*.

Figure 4:
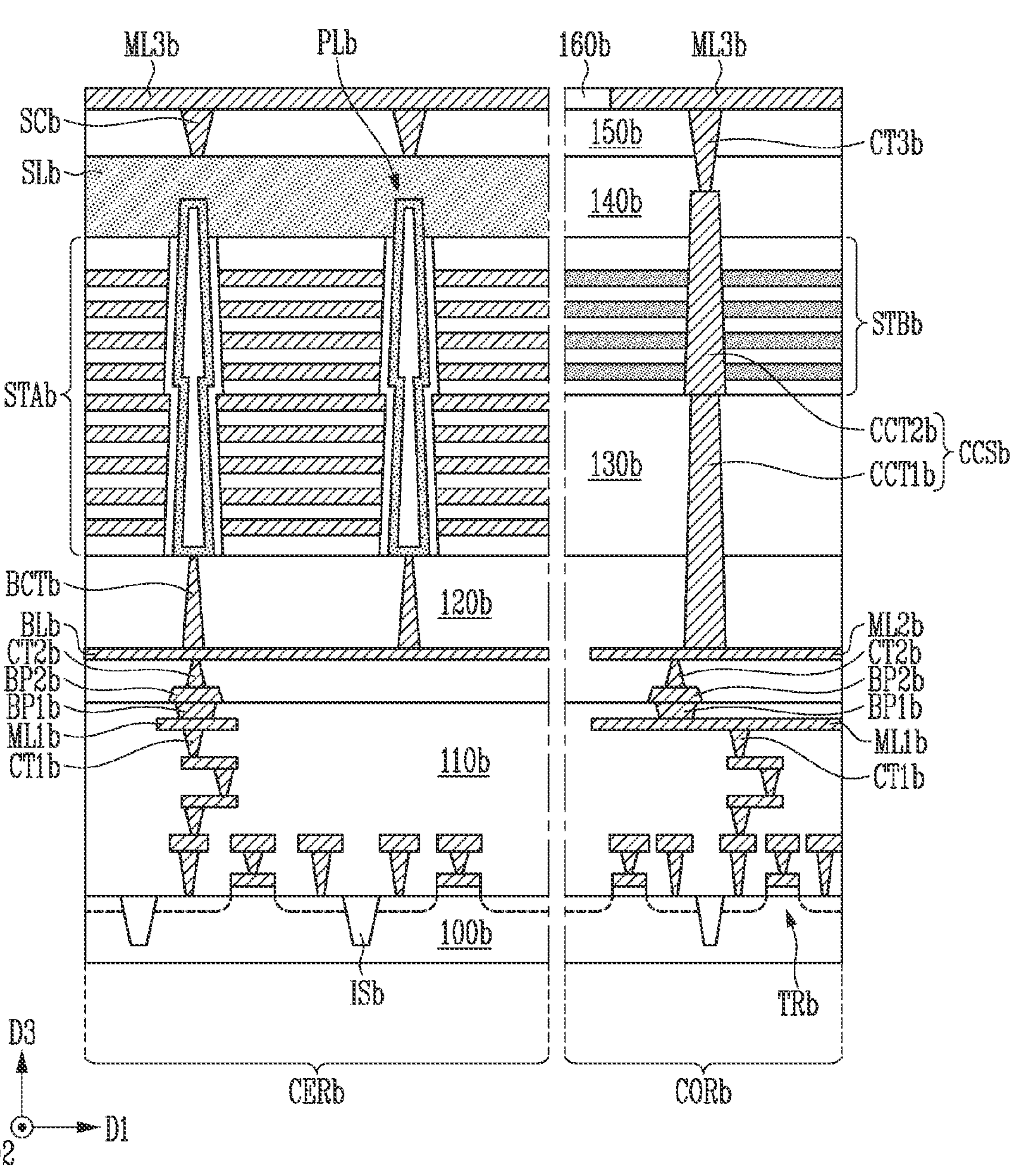
FIG. 4 is a sectional view illustrating a semiconductor device in accordance with an embodiment of the present disclosure.

FIG. 4 is a sectional view illustrating a semiconductor device in accordance with an embodiment of the present disclosure. Hereinbelow, repetitive explanation will be omitted if deemed redundant.

Referring to FIG. 4, the semiconductor device may include a substrate 100*b* with a cell region CERb and a connection region CORb. Peripheral transistors TRb and element separation layers ISb may be provided on the substrate 100*b*.

A first insulating layer 110*b* may be provided to cover the substrate 100*b*. First conductive contacts CT1*b*, first lines ML1*b*, and first bonding pads BP1*b* may be provided in the first insulating layer 110*b*.

A second insulating layer 120*b* may be provided to cover the first insulating layer 110*b*. Second bonding pads BP2*b*, second conductive contacts CT2*b*, a second line ML2*b*, a bit line BLb, and bit line contacts BCTb may be provided in the second insulating layer 120*b*. The bit line contact BCTb may be coupled to the bit line BLb.

A first stacked body STAb, a third insulating layer 130*b*, and a second stacked body STBb may be provided on the second insulating layer 120*b*. Cell plugs PLb may be provided to pass through the first stacked body STAb. The cell plug PLb may be coupled to the bit line contact BCTb. A connection contact structure CCSb may be provided to pass through the second stacked body STBb and the third insulating layer 130*b*. The connection contact structure CCSb may include a first connection contact CCT1*b* and a second connection contact CCT2*b*. The first connection contact CCT1*b* may be coupled to the second line ML2*b*. The level of the lowermost portion of the connection contact structure CCSb may be lower than the level of the lowermost portion of the cell plug PLb in the third direction D3. The level of the lowermost portion of the first connection contact CCT1*b* may be lower than the level of the lowermost portion of the cell plug PLb in the third direction D3. The level of the lowermost portion of the connection contact structure CCSb may be substantially the same as the level of the lowermost portion of the bit line contact BCTb in the third direction D3. Therefore, the level of the lowermost portion of the first connection contact CCT1*b* may be substantially the same as the level of the lowermost portion of the bit line contact BCTb in the third direction D3.

A source layer SLb may be provided on the first stacked body STAb. A fourth insulating layer 140*b* may be provided on the second stacked body STBb. A fifth insulating layer 150*b* may be provided to cover the source layer SLb and the fourth insulating layer 140*b*. Source contacts SCb may be provided in the fifth insulating layer 150*b*. A third conductive contact CT3*b* may be provided to be coupled to the second connection contact CCT2*b* of the connection contact structure CCSb. The fourth conductive contact CT3*b* may be provided in the fourth insulating layer 140*b* and the fifth insulating layer 150*b*. A sixth insulating layer 160*b* may be provided to cover the fifth insulating layer 150*b*. Third lines ML3*b* may be provided in the sixth insulating layer 160*b*.

Figure 5:
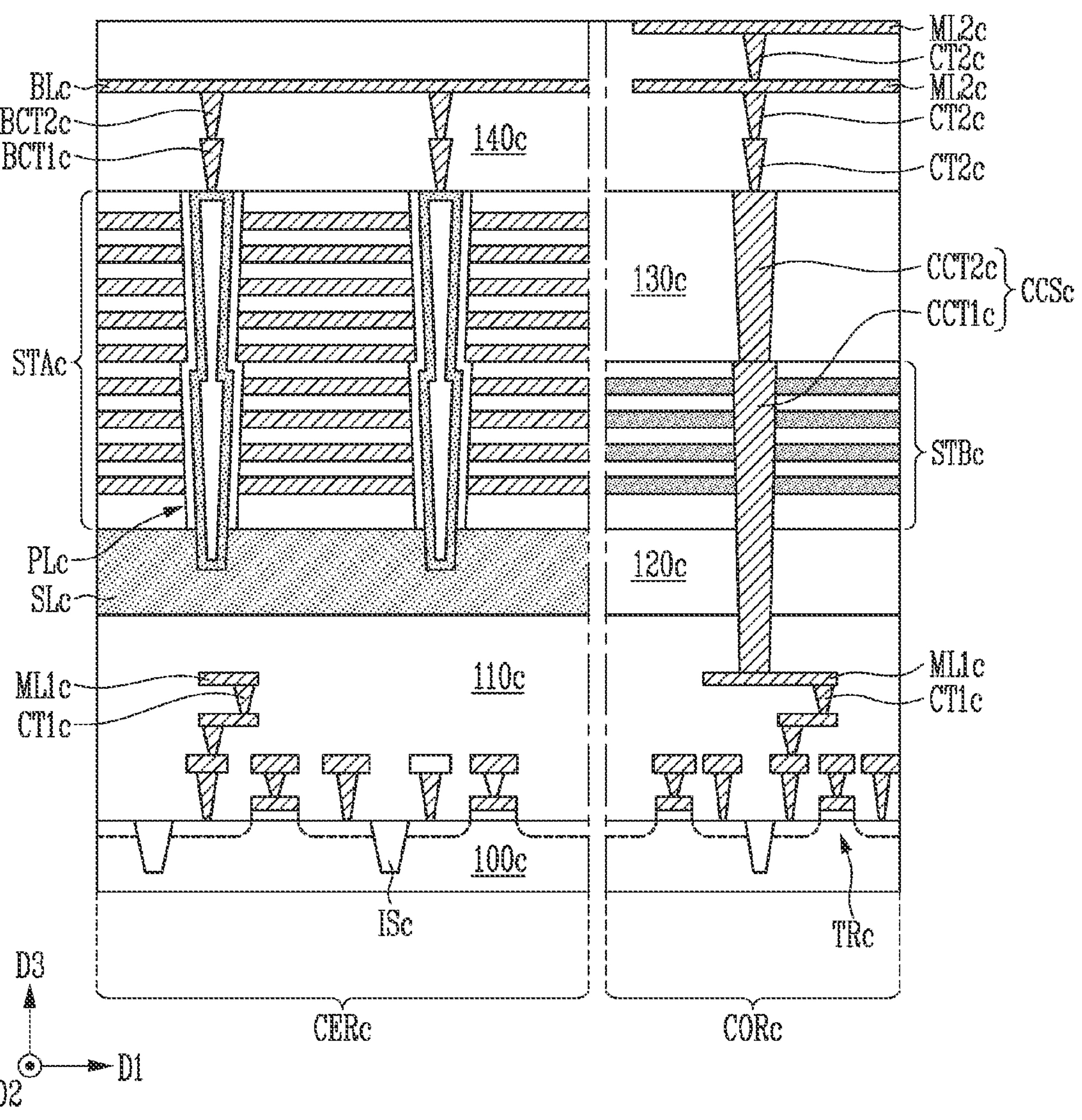
FIG. 5 is a sectional view illustrating a semiconductor device in accordance with an embodiment of the present disclosure.

FIG. 5 is a sectional view illustrating a semiconductor device in accordance with an embodiment of the present disclosure. Hereinbelow, repetitive explanation will be omitted if deemed redundant.

Referring to FIG. 5, the semiconductor device may include a substrate 100*c* with a cell region CERc and a connection region CORc. Peripheral transistors TRc and element separation layers ISc may be provided on the substrate 100*c*.

A first insulating layer 110*c* may be provided to cover the substrate 100*c*. First conductive contacts CT1*c*, first lines ML1*c*, and first bonding pads BP1*c* may be provided in the first insulating layer 110*c*.

A source layer SLc and a second insulating layer 120*c* may be provided on the first insulating layer 110*c*. A first stacked body STAc may be provided on the source layer SLc. A second stacked body STBc and a third insulating layer 130*c* may be provided on the second insulating layer 120*c*. Cell plugs PLc may be provided to pass through the first stacked body STAc. A connection contact structure CCSc may be provided to pass through the third insulating layer 130*c*, the second stacked body STBc, and the second insulating layer 120*c*. The connection contact structure CCSc may include a first connection contact CCT1*c* and a second connection contact CCT2*c*. The first connection contact CCT1*c* may be coupled to the first line ML1*c*. The level of the lowermost portion of the connection contact structure CCSc may be lower than the level of the bottom surface of the source layer SLc in the third direction D3. The level of the lowermost portion of the first connection contact CCT1*c* may be lower than the level of the bottom surface of the source layer SLc in the third direction D3.

The cell plug PLc may include an upper portion and a lower portion. The width of each of the upper and lower portions of the cell plug PLc may decrease as the level decreases, moving down in the negative third direction D3. The width of the first and second connection contacts CCT1*c* and CCT2*c* may decrease as the level decreases, moving down in the negative third direction D3. The level of the boundary between the first and second connection contacts CCT1*c* and CCT2*c* may be substantially the same as the level at which the upper and lower portions of the cell plug PLc contact each other.

A fourth insulating layer 140*c* may be provided to cover the first stacked body STAc and the third insulating layer 130*c*. First bit line contacts BCT1*c*, second bit line contacts BCT2*c*, a bit line BLc, second conductive contacts CT2*c*, and second lines ML2*c* may be provided in the fourth insulating layer 140*c*. The first bit line contact BCT1*c* may be coupled to the cell plug PLc. The second conductive contact CT2*c* may be coupled to the second connection contact CCT2*c* of the connection contact structure CCSc.

Figure 6:
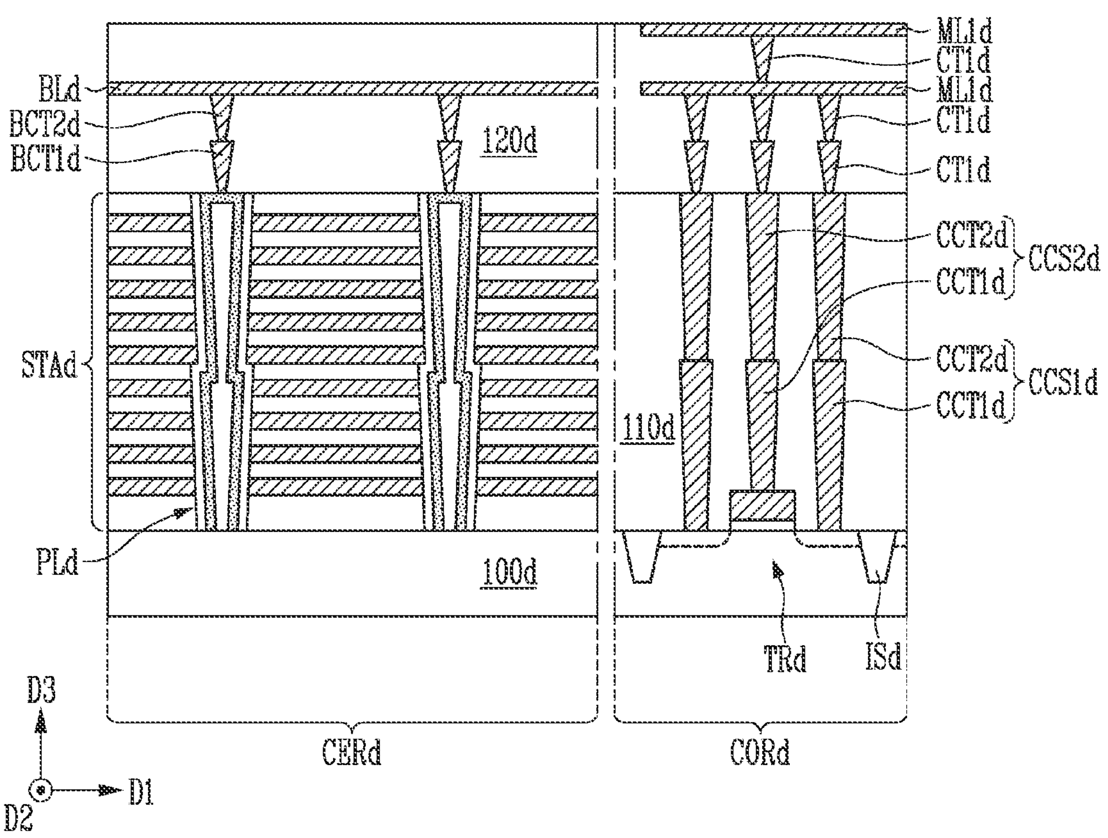
FIG. 6 is a sectional view illustrating a semiconductor device in accordance with an embodiment of the present disclosure.

FIG. 6 is a sectional view illustrating a semiconductor device in accordance with an embodiment of the present disclosure. Hereinbelow, repetitive explanation will be omitted if deemed redundant.

Referring to FIG. 6, the semiconductor device may include a substrate 100*d* with a cell region CERd and a connection region CORd. Peripheral transistors TRd and element separation layers ISd may be provided on the substrate 100*d*.

A first stacked body STAd and a first insulating layer 110*d* may be provided on the substrate 100*d*. Cell plugs PLd may be provided to pass through the first stacked body STAd. A lowermost portion of the cell plug PLd may be in contact with a top surface of the substrate 100*d*. First connection contact structures CCS1*d* and a second connection contact structure CCS2*d* may be provided to pass through the first insulating layer 110*d*.

The first connection contact structure CCS1*d* may include a first connection contact CCT1*d* and a second connection contact CCT2*d*. The level of the lowermost portion of the first connection contact CCT1*d* of the first connection contact structure CCS1*d* may be substantially the same as the level of the lowermost portion of the cell plug PLd. The lowermost portion of the first connection contact CCT1*d* of the first connection contact structure CCS1*d* may be in contact with the top surface of the substrate 100*d*. The second connection contact structure CCS2*d* may include a first connection contact CCT1*d* and a second connection contact CCT2*d*. The level of a lowermost portion of the first connection contact CCT1*d* of the second connection contact structure CCS2*d* may be higher than the level of a lowermost portion of the cell plug PLd. The lowermost portion of the first connection contact CCT1*d* of the second connection contact structure CCS2*d* may be disposed at a higher level than that of the top surface of the substrate 100*d*.

A second insulating layer 120*d* may be provided to cover the first stacked body STAd and the first insulating layer 110*d*. First bit line contacts BCT1*d*, second bit line contacts BCT2*d*, a bit line BLd, first conductive contacts CT1*d*, and first lines ML1*d* may be provided in the second insulating layer 120*d*.

Figure 7A:
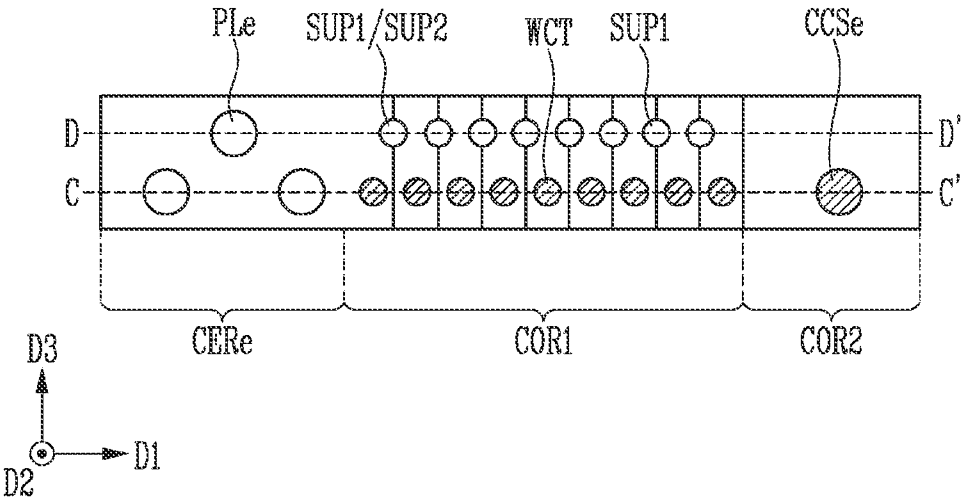
FIG. 7A is a plan view illustrating a semiconductor device in accordance with an embodiment of the present disclosure.
Figure 7B:
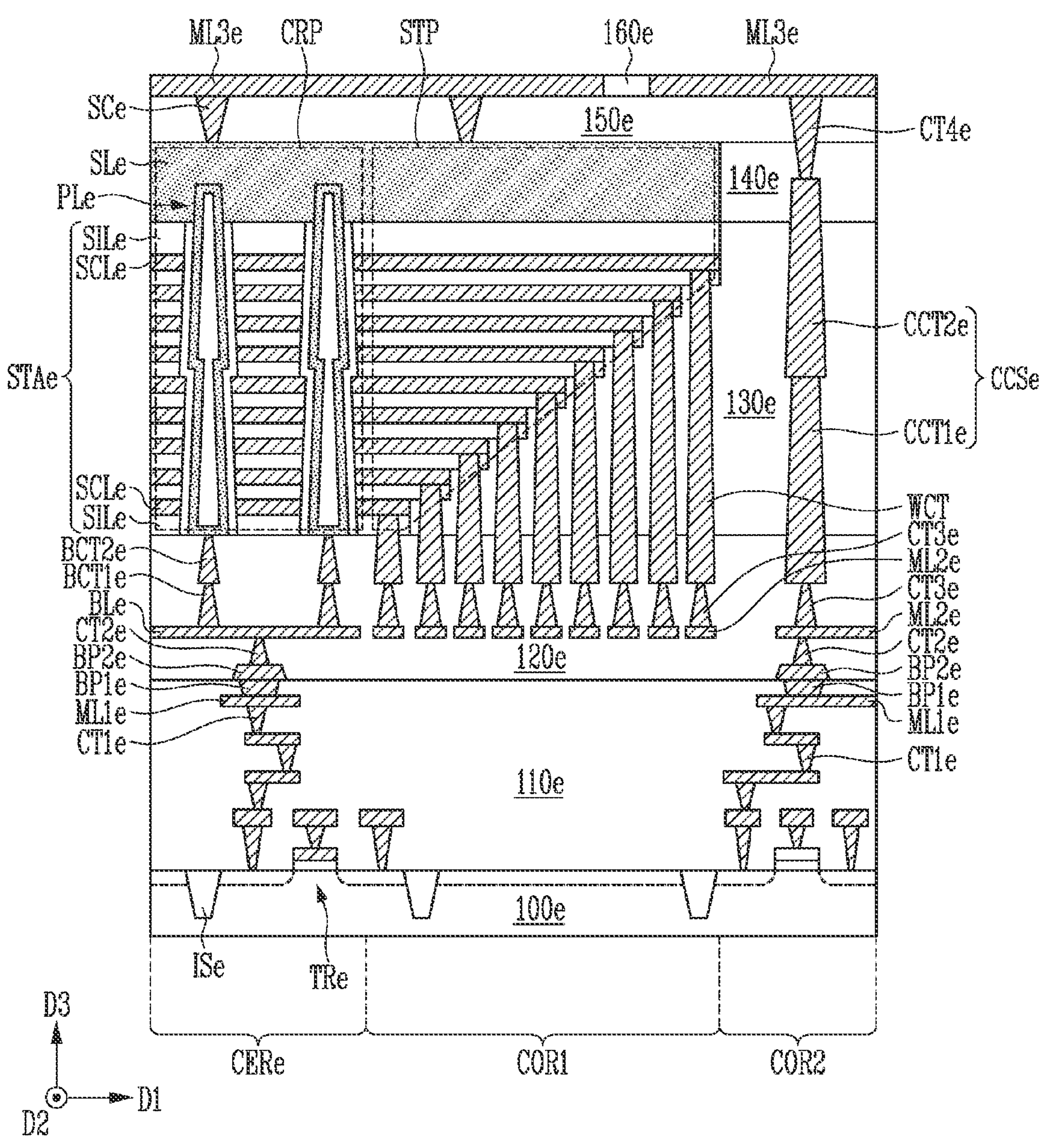
FIG. 7B is a sectional view taken along line C-C' of FIG. 7A.
Figure 7C:
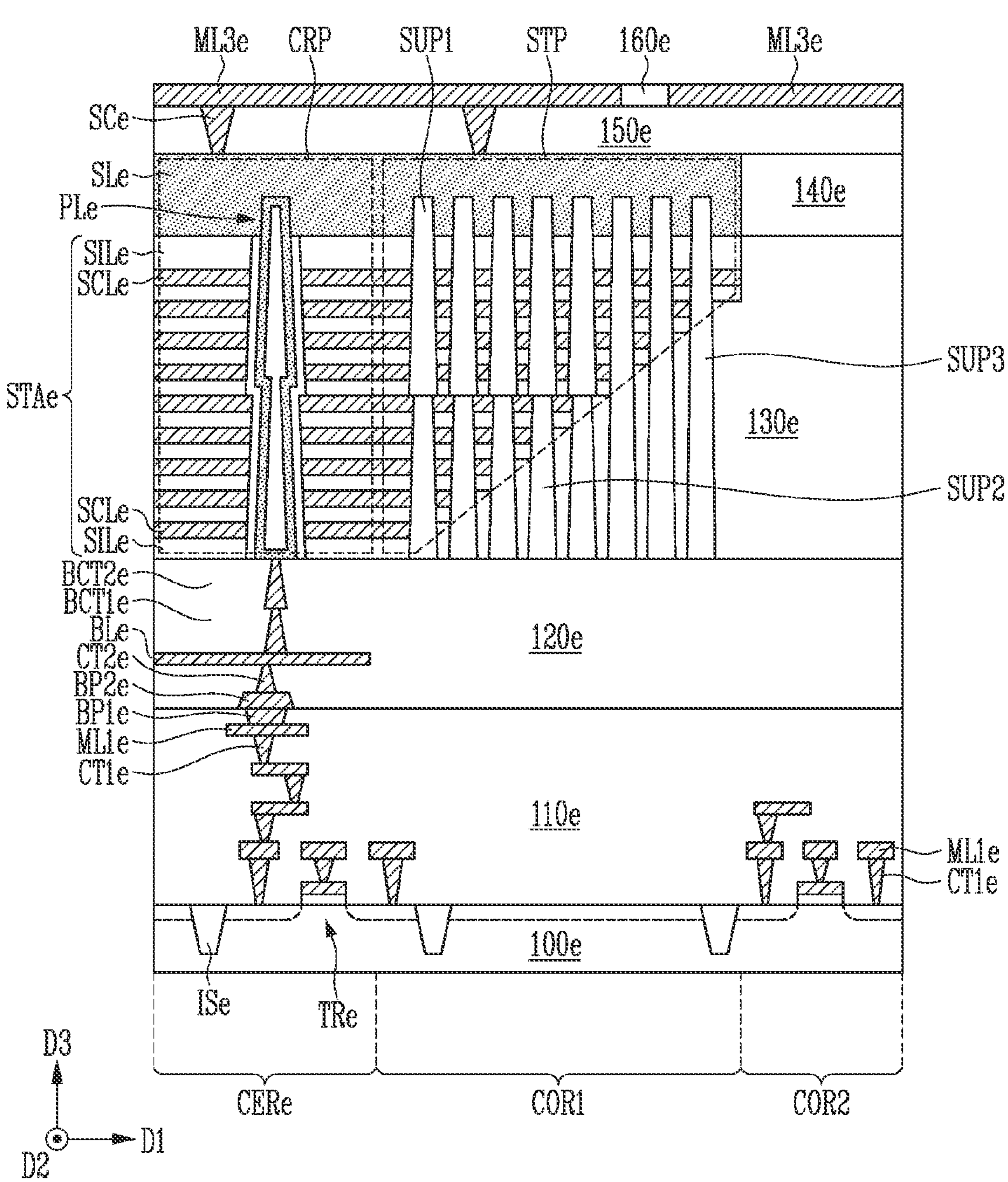
FIG. 7C is a sectional view taken along line D-D' of FIG. 7A.

FIG. 7A is a plan view illustrating a semiconductor device in accordance with an embodiment of the present disclosure. FIG. 7B is a sectional view taken along line C-C' of FIG. 7A. FIG. 7C is a sectional view taken along line D-D' of FIG. 7A. Hereinbelow, repetitive explanation will be omitted if deemed redundant.

Referring to FIGS. 7A to 7C, the semiconductor device may include a substrate 100*e* with a cell region CERe, a first connection region COR1, and a second connection region COR2. Peripheral transistors TRe and element separation layers ISe may be provided on the substrate 100*e*.

A first insulating layer 110*e* may be provided to cover the substrate 100*e*. First conductive contacts CT1*e*, first lines ML1*e*, and first bonding pads BP1*e* may be provided in the first insulating layer 110*e*.

A second insulating layer 120*e* may be provided to cover the first insulating layer 110*e*. Second bonding pads BP2*e*, second conductive contacts CT2*e*, a bit line BLe, second lines ML2*e*, first bit line contacts BCT1*e*, second bit line contacts BCT2*e*, and third conductive contacts CT3*e* may be provided in the second insulating layer 120*e*.

A first stacked body STAe and the third insulating layer 130*e* may be provided on the second insulating layer 120*e*. The first stacked body STAe may include stacked insulating layers SILe and stacked conductive layers SCLe. The first stacked body STAe may include a core portion CRP and a stepped portion STP. The stacked insulating layers SILe and the stacked conductive layers SCLe of the first stacked body STAe may be formed in a stepped shape, thereby defining the stepped portion STP of the first stacked body STAe. The stepped portion STP of the first stacked body STAe may be disposed on the first connection region COR1. The third insulating layer 130*e* may cover the stepped portion STP of the first stacked body STAe. The third insulating layer 130*e* may include a surface corresponding to the stepped portion STP of the first stacked body STAe.

Cell plugs PLe may be provided to pass through the core portion CRP of the first stacked body STAe. Word line contacts WCT coupled to the stepped portion STP of the first stacked body STA may be provided. The word line contact WCT may be coupled to the stacked conductive layer SCLe. The word line contact WCT may be coupled to the third conductive contact CT3*e*. The word line contact WCT may pass through the third insulating layer 130*e*. The word line contact WCT may include a lowermost portion that is in contact with the third conductive contact CT3*e*, and the cell plug PLe may include a lowermost portion that is in contact with the second bit line contact BCT2*e*. The level of the lowermost portion of the word line contact WCT may be lower than the level of the lowermost portion of the cell plug PLe. In an embodiment, unlike the configuration illustrated in the drawing, the level of the lowermost portion of the word line contact WCT may be substantially the same as the level of the lowermost portion of the cell plug PLe.

A connection contact structure CCSe may be provided to pass through the third insulating layer 130*e*. The connection contact structure CCSe may include a first connection contact CCT1*e* and a second connection contact CCT2*e*. The first connection contact CCT1*e* of the connection contact structure CCSe may be coupled to the third conductive contact CT3*e*. The level of the lowermost portion of the connection contact structure CCSe may be substantially the same as the level of the lowermost portion of the word line contact WCT. In other words, the level of the lowermost portion of the first connection contact CCT1*e* may be substantially the same as the level of the lowermost portion of the word line contact WCT. The level of the lowermost portion of the connection contact structure CCSe may be lower than the level of the lowermost portion of the cell plug PLe. The level of a lowermost portion of the first connection contact CCT1*e* may be lower than the level of the lowermost portion of the cell plug PLe. In an embodiment, unlike the configuration illustrated in the drawing, the level of the lowermost portion of the connection contact structure CCSe may be substantially the same as the level of the lowermost portion of the cell plug PLe. In an embodiment, unlike the configuration illustrated in the drawing, the level of the lowermost portion of the first connection contact CCT1*e* may be substantially the same as the level of the lowermost portion of the cell plug PLe.

A source layer SLe may be provided on the first stacked body STAe. A fourth insulating layer 140*e* may be provided on the third insulating layer 130*e*.

First support plugs SUP1 may be provided to pass through the upper portion of the stepped portion STP of the first stacked body STAe. Each of the first support plugs SUP1 may have a cylindrical shape. The first support plugs SUP1 may be enclosed by the stepped portion STP of the first stacked body STAe. The first support plugs SUP1 may extend in the third direction D3. The width of the first support plug SUP1 may decrease as it approaches the source layer SLe. The width of the first support plug SUP1 may be reduced as the level increases, moving up in the third direction D3. The uppermost portion of the first support plug SUP1 may be disposed in the source layer SLe. The uppermost portion of the first support plug SUP1 may be disposed between the top and bottom surfaces of the source layer SLe. The first support plug SUP1 may include an insulating material. For example, the first support plug SUP1 may include oxide.

Second support plugs SUP2 may be provided to pass through the lower portion of the stepped portion STP of the first stacked body STAe. Each of the second support plugs SUP2 may have a cylindrical shape. The second support plugs SUP2 may be enclosed by the stepped portion STP of the first stacked body STAe. The second support plugs SUP2 may extend in the third direction D3. The width of the second support plug SUP2 may decrease as it approaches the source layer SLe. The width of the second support plug SUP2 may be reduced as the level is increased. The second support plug SUP2 may be coupled to the first support plug SUP1. The level of the lowermost portion of the second support plug SUP2 may be substantially the same as the level of the lowermost portion of the cell plug PLe. In an embodiment, unlike the configuration illustrated in the drawing, the level of the lowermost portion of the second support plug SUP2 may be substantially the same as the level of the lowermost portion of the word line contact WCT or the level of the lowermost portion of the first connection contact CCT1*e* of the connection contact structure CCSe.

The level of the boundary between the first and second support plugs SUP1 and SUP2 may be substantially the same as the level of the boundary between the upper and lower portions of the cell plug PLe. The level at which the first and second support plugs SUP1 and SUP2 contact each other may be substantially the same as the level of the boundary between first and second connection contacts CCT1*e* and CCT2*e* of the connection contact structure CCSe. The level of the lowermost portion of the first support plug SUP1 may be substantially the same as the level at which the upper and lower portions of the cell plug PLe contact each other.

Third support plugs SUP3 may be provided to pass through the upper portion of the stepped portion STP of the first stacked body STAe and the third insulating layer 130*e*. Each of the third support plugs SUP3 may have a cylindrical shape. The third support plugs SUP3 may be enclosed by the stepped portion STP of the first stacked body STAe. The third support plugs SUP3 may extend in the third direction D3. The width of the third support plug SUP3 may decrease as it approaches the source layer SLe. The width of the third support plug SUP3 may be reduced as the level increases, moving up in the third direction D3. The uppermost portion of the third support plug SUP3 may be disposed in the source layer SLe. The uppermost portion of the third support plug SUP3 may be disposed between the top and bottom surfaces of the source layer SLe. The level of the lowermost portion of the third support plug SUP3 may be substantially the same as the level of the lowermost portion of the cell plug PLe. In an embodiment, unlike the configuration illustrated in the drawing, the level of the lowermost portion of the third support plug SUP3 may be substantially the same as the level of the lowermost portion of the word line contact WCT or the level of the lowermost portion of the first connection contact CCT1*e* of the connection contact structure CCSe.

A fifth insulating layer 150*e* may be provided to cover the source layer SLe and the fourth insulating layer 140*e*. Source contacts SCe may be provided in the fifth insulating layer 150*e*. A fourth conductive contact CT4*e* passing through the fifth insulating layer 150*e* to be coupled to the second connection contact CCT2*e* of the connection contact structure CCSe may be provided. A sixth insulating layer 160*e* may be provided to cover the fifth insulating layer 150*e*. Third lines ML3*e* may be provided in the sixth insulating layer 160*e*.

Figure 8:
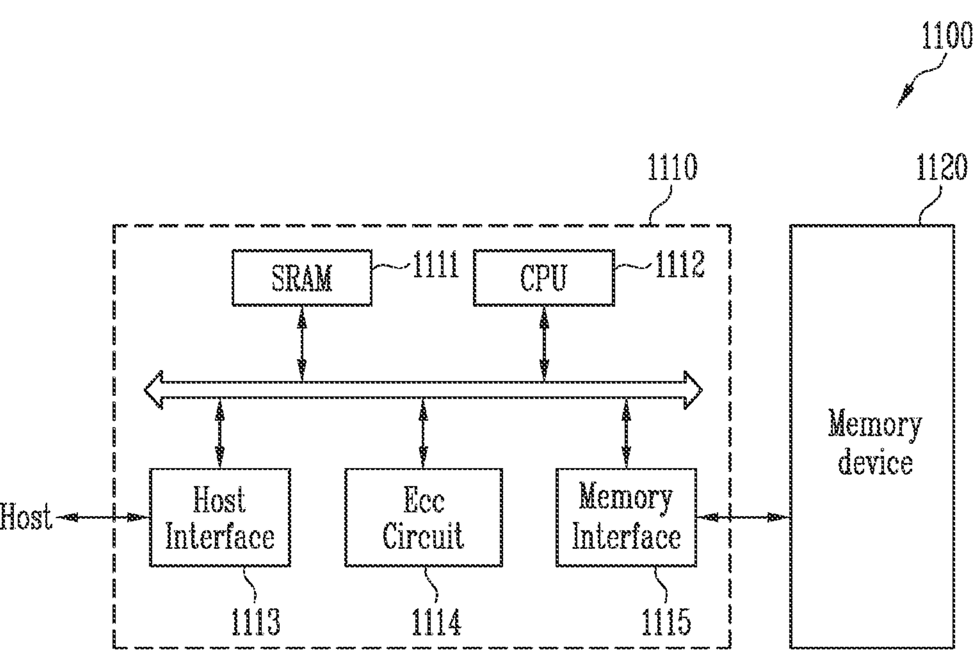
FIG. 8 is a block diagram illustrating the configuration of a memory system in accordance with an embodiment of the present disclosure.

FIG. 8 is a block diagram illustrating the configuration of a memory system in accordance with an embodiment of the present disclosure.

Referring FIG. 8, the memory system 1100 in accordance with an embodiment of the present disclosure includes a memory device 1120 and a memory controller 1110.

The memory device 1120 may include semiconductor devices in accordance with embodiments of the present disclosure. The memory device 1120 may be a multi-chip package formed of a plurality of flash memory chips.

The memory controller 1110 may control the memory device 1120, and include a static random access memory (SRAM) 1111, a central processing unit (CPU) 1112, a host interface 1113, an error correction code (ECC) circuit 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC circuit 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and an integrated drive electronics (IDE) protocols.

Figure 9:
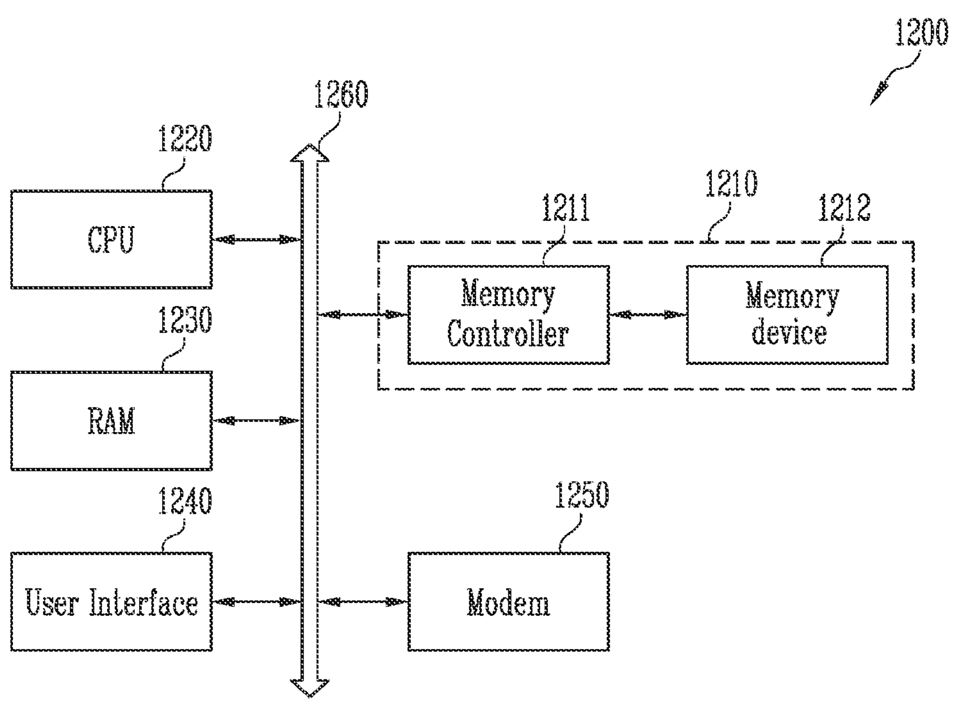
FIG. 9 is a block diagram illustrating the configuration of a computing system according to an embodiment of the present disclosure.

FIG. 9 is a block diagram illustrating the configuration of a computing system according to embodiments of the present disclosure.

Referring to FIG. 9, the computing system 1200 in accordance with embodiments of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying an operating voltage to the computing system 1200. An application chip set, a camera image processor, a mobile DRAM and the like may be further included.

Similarly to the memory system described with reference to FIG. 8, the memory system 1210 may be configured with a memory device 1212 and a memory controller 1211.

In a semiconductor device and a method of manufacturing the semiconductor device in accordance with embodiments of the present disclosure, a connection contact structure is formed to be divided into a plurality of connection contacts, so that the manufacturing time and manufacturing cost of the semiconductor device can be minimized.

What is claimed is:

1. A method of manufacturing a semiconductor device, comprising:

forming first stacked insulating layers and first stacked sacrificial layers;

forming a cell sacrificial structure passing through the first stacked insulating layers and the first stacked sacrificial layers;

forming a first connection contact at substantially the same level as the cell sacrificial structure;

forming second stacked insulating layers and second stacked sacrificial layers on the cell sacrificial structure;

forming a first hole to expose the cell sacrificial structure;

removing the cell sacrificial structure to form a second hole;

forming a cell plug in the first and second holes;

forming a third hole to expose the first connection contact; and forming a second connection contact in the third hole that is coupled to the first connection contact.

2. The method according to claim 1, wherein the second connection contact is formed at substantially the same level as the first hole.

3. The method according to claim 1, wherein the first connection contact is formed when the cell sacrificial structure is formed.

4. The method according to claim 1, wherein the first connection contact comprises the same material as the cell sacrificial structure.

5. The method according to claim 1, further comprising:

flipping the cell plug, the first connection contact, and the second connection contact upside down.

6. The method according to claim 1, further comprising:

electrically connecting the cell plug, the first connection contact, and the second connection contact to a peripheral transistor.

7. The method according to claim 6, wherein electrically connecting the cell plug, the first connection contact, and the second connection contact to the peripheral transistor comprises:

bonding a first bonding pad that is coupled to the cell plug, the first connection contact, and the second connection contact to a second bonding pad that is coupled to the peripheral transistor.

* * * * *